(12) United States Patent
Trutna, Jr. et al.

(10) Patent No.: US 7,197,208 B2
(45) Date of Patent: Mar. 27, 2007

(54) WAVELENGTH TUNABLE LIGHT SOURCES AND METHODS OF OPERATING THE SAME

(75) Inventors: William R. Trutna, Jr., Atherton, CA (US); Geraint Owen, Palo Alto, CA (US)

(73) Assignee: Agilent Technologies, Santa Clara, CA (US)

( * ) Notice: Subject to any disclaimer, the term of this patent is extended or adjusted under 35 U.S.C. 154(b) by 272 days.

(21) Appl. No.: 10/823,191

(22) Filed: Apr. 13, 2004

(65) Prior Publication Data

US 2005/0226557 A1   Oct. 13, 2005

(51) Int. Cl.
*G02B 6/34* (2006.01)
*G02B 6/36* (2006.01)

(52) U.S. Cl. .............................. 385/37; 385/27; 385/28

(58) Field of Classification Search .................. 389/37, 389/28, 27

See application file for complete search history.

(56) References Cited

U.S. PATENT DOCUMENTS

| | | | |
|---|---|---|---|
| 3,696,310 A * | 10/1972 | Paoli et a. ..................... 372/18 |
| 3,774,121 A * | 11/1973 | Ashkin et al. ................ 372/53 |
| 4,588,296 A * | 5/1986 | Cahill et al. ................. 356/462 |
| 4,702,600 A * | 10/1987 | Handrich et al. ........... 356/461 |
| 4,707,835 A | 11/1987 | Mocker | |
| 5,128,798 A * | 7/1992 | Bowen et al. .............. 359/260 |

(Continued)

FOREIGN PATENT DOCUMENTS

EP   0 524 382 A2   4/1992

OTHER PUBLICATIONS

Kourogi, M. et al., "Continuous Tuning of an Electrically Tunable External-Cavity Semiconductor Laser", Optics Letters, Optical Society of America, vol. 25, No. 16, Aug. 15, 2000, pp. 1165-1167.

(Continued)

*Primary Examiner*—Kaveh Kianni

(57) ABSTRACT

Wavelength tunable light sources and methods of operating the same are described. In one aspect, a wavelength tunable light source includes a resonant light path, an optical gain medium, an optical grating, a first acousto-optic deflector, and a second acousto-optic deflector. In another aspect, a light source has a resonant light path containing first and second acousto-optic devices for tuning an output light beam over a specified frequency range with an output wavelength profile. The first acousto-optic device is driven with a first signal having a first time-varying frequency profile. The second acousto-optic device is driven with a second signal having a second time-varying frequency profile, wherein the second time-varying frequency profile differs from the first time-varying frequency profile by an amount substantially proportional to a time rate is of change of the output wavelength profile. In this way, the output light beam is tunable over the specified frequency range without observable hopping between longitudinal modes.

23 Claims, 4 Drawing Sheets

U.S. PATENT DOCUMENTS

| | | | |
|---|---|---|---|
| 5,140,599 | A | 8/1992 | Trutna, Jr. et al. |
| 5,724,373 | A | 3/1998 | Chang |
| 5,894,492 | A | 4/1999 | Welch et al. |
| 5,923,685 | A | 7/1999 | Akagawa et al. |
| 6,031,852 | A * | 2/2000 | Thompson et al. ........... 372/20 |
| 6,141,360 | A | 10/2000 | Kinugawa et al. |
| 6,151,427 | A * | 11/2000 | Satorius ........................ 385/7 |
| 6,282,215 | B1 | 8/2001 | Zorabedian et al. |
| 6,339,603 | B1 | 1/2002 | Fanders et al. |
| 6,345,059 | B1 | 2/2002 | Flanders |
| 6,493,129 | B2 | 12/2002 | Terahara et al. |
| 6,526,071 | B1 | 2/2003 | Zorabedian et al. |
| 6,556,599 | B1 | 4/2003 | Svilans |
| 6,608,949 | B2 | 8/2003 | Kim et al. |
| 2003/0219094 | A1 * | 11/2003 | Basting et al. ................ 378/34 |

OTHER PUBLICATIONS

Kourogi, M. et al., "Continuous Tuning of an Electrically Tunable External-Cavity Semiconductor Laser" Optics Letters, vol. 25, No. 16, Aug. 15, 2000, pp. 1165-1167.

* cited by examiner

WAVELENGTH TUNABLE LIGHT SOURCES AND METHODS OF OPERATING THE SAME

BACKGROUND

Many wavelength tunable light sources include a resonant optical cavity that includes an optical gain element and one or more filter elements. The optical resonant optical cavity quantizes light oscillation to a discrete set of evenly-spaced optical modes most of which are quenched by the filter elements. In many applications, it is desirable to produce a single-wavelength output beam in a single optical mode so that the light source may be tuned continuously without mode hopping over a specified range of frequencies. To achieve this result, the optical modes of the resonant cavity and the frequency response of the filter elements of the light source must be tuned simultaneously. In addition, the ratio of the filter bandwidth to the optical mode spacing should be relatively small to achieve high mode stability.

Some types of wavelength tunable light sources use a moving mirror grating to tune the light sources to produce an output beam of a particular wavelength. For example, in one approach, the so-called "Littrow" configuration, an optical cavity is formed between a facet on a semiconductor laser and a diffraction grating. A collimating lens focuses a light beam generated by the laser onto the grating. In the cavity formed by the facet and the grating there is only a single wavelength (i.e., the "Littrow wavelength") of light that exactly satisfies the condition that the angle of light incident on the grating be the same as the angle of light diffracted from the grating. In this way, only light at or very near the Littrow wavelength oscillates between the facet and the grating. The Littrow wavelength is changed by simultaneously rotating the grating and moving the grating toward or away from the facet.

Other types of light sources use tunable acousto-optic devices to produce an output beam of a particular wavelength. An acousto-optic device typically includes a transducer for generating acoustic waves in an optical medium. Light injected into the optical medium interacts with the acoustic waves to modify characteristics of the injected light. For example, in an acousto-optic modulator, acoustic waves propagating in the optical medium are used to modulate the intensity of the injected light. In an acousto-optic deflector, the acoustic waves deflect the injected light beam by an amount that varies with the acoustic frequency. In an acousto-optic tunable filter, only injected light within a narrow wavelength passband is converted from one polarization to another polarization and a polarization filter selectively passes light with the converted polarization. The wavelength passband is determined by the acoustic frequency applied to the acousto-optic deflectors.

Each of the above-mentioned acousto-optic devices induces a Doppler frequency shift in the beam, where the direction of the shift depends on the propagation direction of the acoustic waves with respect to the light beam. The Doppler frequency shift induced by a single acousto-optic device accumulates as the light beam oscillates in the resonant cavity of a light source, preventing single-frequency operation of the light source. For this reason, many acousto-optic-based light sources include at least one pair of acousto-optic devices that produce substantially offsetting Doppler frequency shifts.

In one approach, a pair of acousto-optic devices is used in a laser or other optical resonator to produce a wavelength-dependent deflection of the light without incurring a net frequency shift. In this approach, the dispersive quality of acousto-optic devices in transmission is used as a reflection grating substitute. Two mirrors, one an output coupler, a gain medium and two acousto-optic devices are arranged for maximum efficiency such that the incident and diffracted beams are approximately at the Bragg angle for each acousto-optic device. In this way, the output wavelength is determined by the acoustic frequency of the acousto-optic devices.

In another approach, an external cavity laser is formed by feeding light from a laser through two or more acousto-optic tunable filters and back to the laser. The Doppler shifts introduced by the filters do not entirely cancel. The net Doppler shift caused by the filters is continuously tuned to cause the bandpass of the filter to follow the shifting resonating frequency of the laser to reduce mode hopping.

SUMMARY

The invention features wavelength tunable light sources and methods of operating the same. The invention enables the design of light sources that are capable of generating output beams that may be rapidly and continuously swept over specified frequency ranges without mode hopping. The invention also enables an inventive method of operating a light source that simultaneously tunes the optical modes and the filter frequency response of the light source to achieve continuous tuning of the light source over a specified frequency range.

In one aspect, the invention features a wavelength tunable light source that includes a resonant light path, an optical gain medium, one or more optical gratings, a first acousto-optic deflector, and a second acousto-optic deflector. The resonant light path supports oscillation of light in at least one longitudinal mode. The optical gain medium is disposed in the resonant light path. The optical grating has a grating surface arranged to receive incident light along the light path at an incidence angle relative to the grating surface and to diffract light along the light path at a diffraction angle relative to the grating surface that is different from the incidence angle. The first acousto-optic deflector is arranged to intercept light along the light path. The first acousto-optic deflector is operable to deflect the intercepted light and to induce a first Doppler shift of longitudinal mode frequencies. The second acousto-optic deflector arranged to intercept light along the light path. The second acousto-optic deflector is operable to deflect the intercepted light and to induce a second Doppler shift of longitudinal mode frequencies, wherein the first and second Doppler shifts are in opposite directions.

In another aspect, the invention features a method of wavelength tuning a light source. The light source has a resonant light path supporting at least one longitudinal mode. The resonant light path contains first and second acousto-optic devices for tuning an output light beam over a specified frequency range with an output wavelength profile. Each acousto-optic device induces a respective Doppler frequency shift of longitudinal mode frequencies supported by the resonant light path, wherein the Doppler frequency shift induced by the first acousto-optic device substantially cancels the Doppler frequency shift induced by the second acousto-optic device. In accordance with this inventive method, the first acousto-optic device is driven with a first signal having a first time-varying frequency profile. The second acousto-optic device is driven with a second signal having a second time-varying frequency profile, wherein the second time-varying frequency profile differs from the first time-varying frequency profile by an amount substantially proportional to a time rate of change of the output wavelength profile. In this way, the output light beam is tunable over the specified frequency range without observable hopping between longitudinal modes.

Other features and advantages of the invention will become apparent from the following description, including the drawings and the claims.

DETAILED DESCRIPTION

In the following description, like reference numbers are used to identify like elements. Furthermore, the drawings are intended to illustrate major features of exemplary embodiments in a diagrammatic manner. The drawings are not intended to depict every feature of actual embodiments nor relative dimensions of the depicted elements, and are not drawn to scale.

Figure 1:
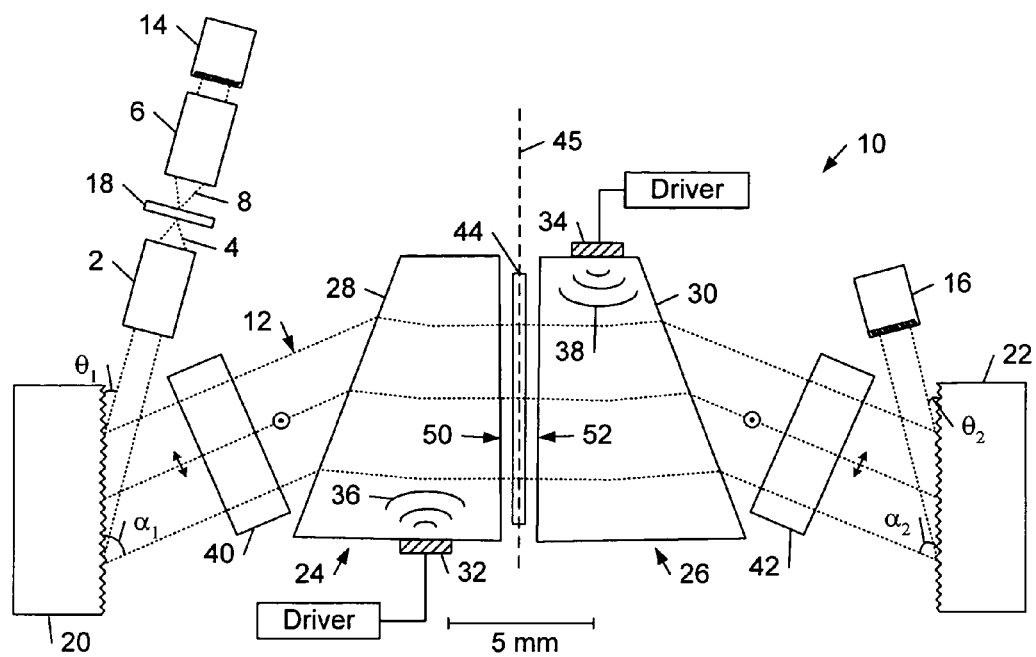
FIG. 1 is a diagrammatic plan view of an embodiment of a wavelength tunable light source.

FIG. 1 shows an embodiment of a wavelength tunable light source 10 that includes a resonant light path 12 that is defined between first and second mirrors 14, 16, and contains an optical gain medium 18, first and second optical gratings 20, 22, and first and second acousto-optic deflectors 24, 26.

The optical gain medium 18 may be any type of optical gain medium that is configured to amplify light oscillating along the optical path 12. In the illustrated embodiment, the optical gain medium is a semiconductor amplifier, which amplifies light by optically stimulated recombination of holes and electrons in a PN junction. The light emitted from the semiconductor amplifier is characterized by a finite spread of photon energy centered close to the bandgap energy of the active region material of the semiconductor amplifier. A first collimating lens 2 transforms the diverging optical beam 4 from the gain medium into a parallel optical beam. Similarly, a second collimating lens 6 transforms the diverging optical beam 8 into a parallel optical beam.

In the illustrated embodiment, each of the optical gratings 20, 22 includes a reflective substrate with a diffractive surface that includes an array of fine, parallel, equally spaced grooves ("rulings"). In response to an incident light beam, the grooves produce diffractive and mutual interference effects that concentrate reflected light in discrete directions (often referred to as "orders" or "spectral orders"). The groove dimensions and groove spacing (or "pitch") are on the order of the target wavelength of the output light generated by the light source 10. In other embodiments, the reflection-type of optical gratings shown in FIG. 1 may be replaced by transmission-type of optical grating.

Each of the acousto-optic deflectors 24, 26 respectively includes a birefringent crystal substrate 28, 30 (e.g., tellurium dioxide or lithium niobate) and an electromechanical transducer 32, 34, which may by implemented by, for example, a single piezoelectric transducer or an array of piezoelectric transducers. The transducers 32, 34 may be driven by a single RF generator or by multiple respective RF generators. The transducers 32, 34 are coupled to the one or more RF generators by a matching network. In response to received RF drive signals, the transducers 32, 34 respectively generate acoustic waves 36, 38 in the birefringent crystal substrates 28, 30 at an acoustic frequency corresponding to the frequency of the RF drive signals. The acousto-optic deflectors 24, 26 are arranged so that the light deflection and the Doppler frequency shifts induced in light traveling through the substrates 28, 30 by the acoustic waves 36, 38 are in opposite directions.

The illustrated embodiment also includes first and second half-wave plates 40, 42 that are positioned in the light path 12 to rotate the polarization of the oscillating light from parallel to the plane of FIG. 1 to perpendicular to the plane of FIG. 1, and vice versa, as shown. In addition, an optional polarizer 44 is positioned between the first and second acousto-optic deflectors 24, 26. Other embodiments may not include the first and second half-wave plates 40, 42 and the polarizer 44.

In the illustrated embodiment, the first grating 20 and the first acousto-optic deflector 24 are arranged in a first segment of the light path 12 to produce a first optical frequency function, and the second grating 22 and the second acousto-optic deflector 26 are arranged in a second segment of the light path 12 to produce a second optical frequency function substantially identical to the first optical frequency filter function. In this embodiment, the first light path segment substantially corresponds to a mirror image of the second light path reflected through a mirror plane 45 that is perpendicular to the plane of FIG. 1 and is oriented normal to the light beam at the location of the polarizer 44. The symmetrical arrangement of the first and second light segments corrects for light dispersion by the acousto-optic deflectors 24, 26 that otherwise would inhibit proper light oscillation along the light path 12.

In operation, the semiconductor amplifier gain medium 18 generates light that has a horizontal polarization, which is parallel to the plane of FIG. 1. The horizontally polarized light diverges toward the collimating lens 2, which transforms the light into a parallel beam. The first optical grating 20 intercepts the incident parallel beam at an incidence angle $\theta_1$ relative to the grating surface and diffracts the light along the light path 12 at a diffraction angle $\alpha_1$ relative to the grating surface, where the diffraction angle $\alpha_1$ is different from the incidence angle $\theta_1$. This configuration of the first optical grating 20 relative to the incident and diffracted light beams produces a narrow filter passband that contributes to the overall resistance of the light source 10 to mode hopping. The first half-wave plate 40 rotates the polarization of the beam diffracted from the first optical grating 20 to a vertical polarization, which is perpendicular to the plane of FIG. 1.

The vertically polarized beam enters the first acousto-optic deflector 24, which deflects the beam away from the transducer 32 and upshifts the frequency of the vertically polarized beam by an amount corresponding to the acoustic frequency of the acoustic waves 36. The deflected and upshifted beam exits the planar face 50 of the first acousto-optic deflector 24 at normal incidence and passes through the polarization filter 44. The filtered beam then passes into the planar face 52 of the second acousto-optic deflector 24 at normal incidence. The second acousto-optic deflector 24 deflects the beam toward the transducer 34 and downshifts the frequency of the beam by an amount corresponding to the acoustic frequency of the acoustic waves 38. In some implementations, the second acousto-optic deflector 24 is driven in such a way as to substantially cancel the spectral shifting of the light beam by the first acousto-optic deflector 24.

The second half-wave plate 42 rotates the vertical polarization of the beam deflected by the second acousto-optic deflector 26 to a horizontal polarization, which is parallel to the plane of FIG. 1. The second optical grating 22 intercepts the incident parallel beam at an incidence angle $\alpha_2$ relative to the grating surface and diffracts the light along the light path 12 at a diffraction angle $\theta_2$, which is different from the incidence angle $\alpha_2$. This configuration of the second optical grating 22 relative to the incident and diffracted light beams produces a narrow filter passband that contributes to the overall resistance of the light source 10 to multi-mode oscillation. The second mirror 16 intercepts the beam diffracted by the second optical grating 22 and reflects the intercepted beam back toward the second optical grating 22.

On the return trip, the light beam traverses the same light beam path 12 back to the gain medium 18, which amplifies the return beam. The amplified beam diverges from the semiconductor amplifier gain medium 18 toward the second collimating lens 6, which transforms the light into a parallel beam. The first mirror 14 intercepts the parallel beam and reflects the intercepted beam back toward the first collimating lens 6 along the same beam path, thereby completing the resonant light path 12. An output beam may be extracted from the light path at any convenient location. In one implementation, the extracted output beam corresponds to a specular reflection from the second optical grating 22.

Figure 2A:
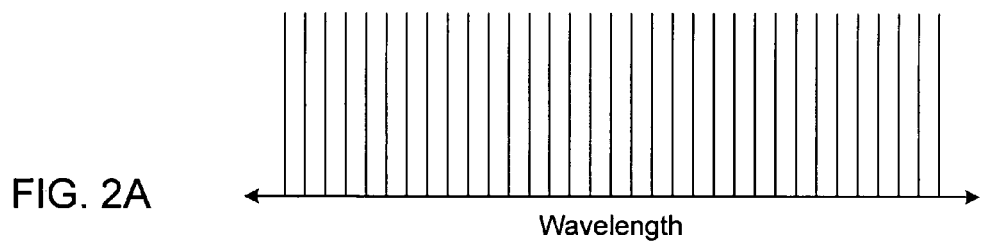
FIG. 2A shows exemplary optical cavity modes of a resonant light path in an implementation of the wavelength tunable light source of FIG. 1.

The first and second mirrors 14, 16 are highly reflective mirrors that cause light to oscillate back-and-forth along the resonant optical path 12. Since the phase of the optical field must be continuous after one round trip, the resonant optical path 12 constrains the oscillating light to a discrete set of resonant optical frequencies. These resonant frequencies are equally spaced by an interval c/(L), where c is the speed of light, and L is the round-trip optical length of the optical path 12. The terms "longitudinal modes" and "optical modes" are used interchangeably herein to refer to the resonant frequencies of the resonant optical path 12. FIG. 2A shows an exemplary set of longitudinal modes specified as a function of the wavelength of the oscillating light.

In one mode of operation, the acousto-optic deflectors 24, 26 and their consequent Doppler shift allow the cavity modes to be tuned in a very convenient manner. In particular, the cavity modes are tuned by applying drive signals at the same acoustic frequencies to the first and second transducers 32, 34 and adjust the phase difference between the drive signals. In the standing wave cavity defined by mirrors 14, 16 every $\pi$ radians of phase difference tunes the cavity by one mode spacing. In a ring cavity, such as that shown in FIG. 5, every $2\pi$ radians of phase difference tunes the cavity modes by one mode spacing. This "phase tuning" technique has been demonstrated to work over a limited tuning range, for example of 100 mode spacings or less. However, a mode hop inevitably occurs: at this point, the mode that was oscillating extinguishes and a different mode starts up. To prevent mode hopping of this sort, the constraint that the two drive frequencies for the acousto-optic devices be equal is removed. The unequal frequencies of the drive signals are tuned in synchronism with the phase tuning of the optical mode which is oscillating. Continuous tuning without mode hopping over an extended frequency range results if the unequal drive frequencies are varied in the manner described in detail below, in which different frequencies are applied to the transducers 32, 34 of the first and second acousto-optic deflectors 24, 26 at any given time.

The combined beam deflections by the first and second acousto-optic deflectors 24, 26 and the wavelength-dependent beam diffractions by the first and second optical gratings 20, 22 configure beam path 12 such that only light of a single wavelength is precisely imaged onto the optimal location of the gain medium 18 for amplification. The images of light of different wavelengths are displaced from the optimal amplification location on the gain medium 18. Once the displacement exceeds the cross section of the gain medium 18, there is no more amplification of it. In this, way, the filter passband is set by this cross section in conjunction with the pitch of the first and second optical gratings 20, 22, the physical layout of the components in the resonant light path, and the acousto-optical characteristics of the first and second acousto-optic deflectors 24, 26.

Figure 2B:
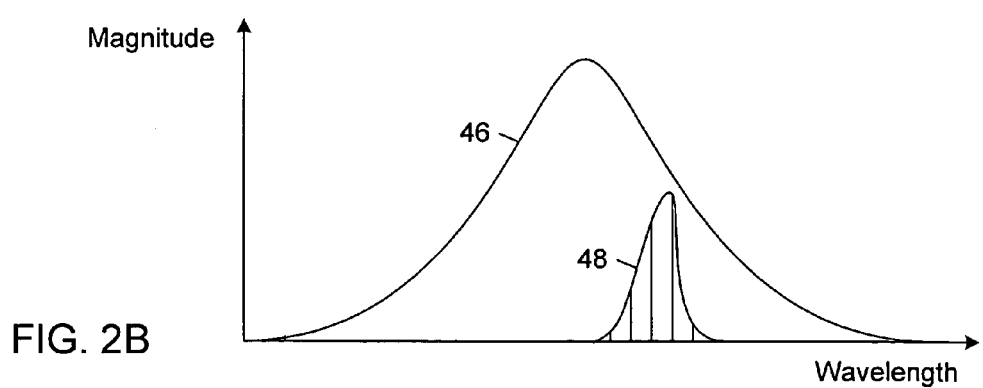
FIG. 2B is a graphical illustration of the spectral features of an implementation of the wavelength tunable light source of FIG. 1.

FIG. 2B shows an exemplary plot of the overall gain 46 of the gain medium 18. In addition, FIG. 2B shows an exemplary plot of the net optical gain 48 per light path round trip, which is the product of the overall gain 46 and the filter function created by the optical gratings 20, 22 and the acousto-optic deflectors 24, 26. As shown in FIG. 2B, filter function creates a narrow passband of wavelengths that are amplified by the light source 10. This passband encompasses only a limited number of longitudinal modes, as shown diagrammatically in FIG. 2B. It is often desirable for there to be only one cavity mode within the filter function passband that oscillates in the resonant optical path 12 at any given time. The relatively small number of optical modes (e.g., 1–10 optical modes) within the filter function passband enhances the ability of the light source 10 to reliably produce output corresponding to a single longitudinal mode.

The RF drive signals that are applied to the first and second acousto-optic deflectors 24, 26 tune the filter function passband. Thus, the mode of light oscillating in the light source 10 is selected by tuning the first and second acousto-optic deflectors 24, 26. For example, in one exemplary implementation, the resonant light path and the acousto-optic deflector geometries are configured such that, when both acoustic transducers 32, 34 are vibrating at 50 MHz, the oscillating light wavelength is about 1550 nm. The frequency of the oscillating light may be tuned continuously over a specified range of frequencies by changing the tuning of the acousto-optic deflectors. For example, in the exemplary implementation described above, when the acoustic frequency is 30 MHz the oscillating light wavelength is about 1600 nm, and when the acoustic frequency is 70 MHz the oscillating light wavelength is about 1500 nm. The oscillating light frequency may be tuned continuously without mode hopping by simultaneously tuning the cavity modes and the filter frequency such that the resonating longitudinal mode always remains at the same point within the filter transmission spectrum.

Figure 3:
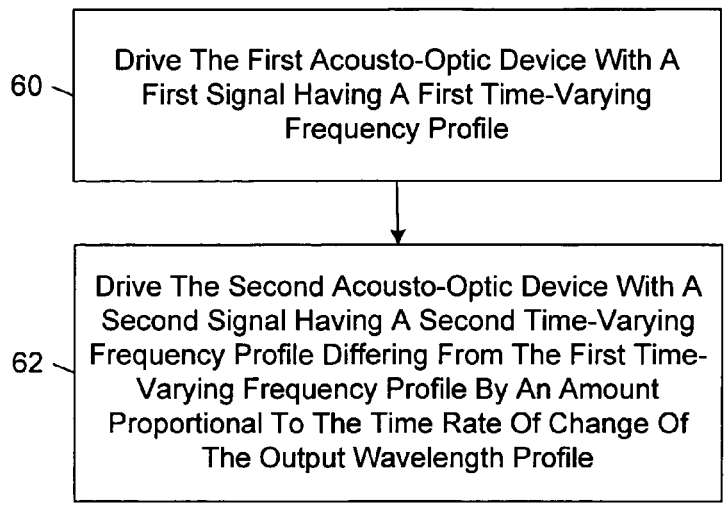
FIG. 3 is a flow diagram of an embodiment of a method of operating the wavelength tunable light source of FIG. 1.

In some implementations, continuous frequency tuning of the oscillating light may be achieved by driving the first and second acousto-optic deflectors at slightly different acoustic frequencies $f_1$ and $f_2$, respectively. In these implementations, the Doppler shifts of the oscillating light by the acousto-optical deflectors 24, 26 will not precisely cancel. If the drive frequencies $f_1$ and $f_2$ are held constant, but different, the resonating mode will ultimately tune outside of the filter function passband. Thus, in order to achieve continuous tuning, the absolute drive frequencies of the first and second acousto-optic deflectors 24, 26 must be adjusted simultaneously so as to track the resonating mode FIG. 3 shows a method of continuously tuning the wavelength of the light oscillating in light source 10. In accordance with this method, the first acousto-optic deflector 24 is driven with a first signal having a first time-varying frequency profile (or signature) (block 60). The second acousto-optic deflector 26 is driven with a second signal having a second time-varying frequency profile (block 62).

The first and second time-varying frequency profiles differ by an amount proportional to the time rate of change of the desired output wavelength profile, as explained in detail below. For example, in implementations where the time rate of change of the output wavelength profile is constant (e.g., a ramp wavelength profile), the second time-varying frequency profile may correspond to a time-shifted version of the first time-varying frequency profile.

The condition for continuous tuning for the "linear" or "standing wave" light source 10 is given by equation (1):

$$\frac{dv}{dt} = 2 \cdot \frac{f_1 - f_2}{T} \quad (1)$$

In this equation, $f_1$ and $f_2$ are the acoustic frequencies of the two acousto-optic deflectors, T is the time for the beam to travel once around the cavity (from a given starting position back to the same position), and dv/dt is the rate of change of optical frequency with time. Thus, in the steady state, the two acousto-optic deflectors work at the same frequency, but if continuous tuning is to be maintained while the optical frequency is being changed, then the acousto-optic deflectors must be run at different frequencies which must satisfy equation (1) above. In terms of optical wavelength ($\lambda$), equation (1) may be rewritten as:

$$\alpha \frac{d\lambda}{dt} = 2 \cdot (f_2 - f_1) \quad (2)$$

where $$\alpha = \frac{L}{\lambda^2} \quad (3)$$

and L is the optical round-trip cavity length. For a round trip cavity length of 450 mm and an oscillating light wavelength of 1.5 μm, $\alpha = 2 \times 10^5$ μm$^{-1}$. Thus, given the desired wavelength profile as a function of time, this equation specifies what the difference between the two acoustic frequencies must be to assure continuous tuning.

A second equation, which describes the relationship between the optical pass frequency of the filter and the acoustic AOD driving frequencies, also relates $\lambda$ to $f_1$ and $f_2$. This second equation has the form:

$$\frac{1}{2}(f_2 + f_1) = A + B\lambda \quad (4)$$

where A and B are constants determined by the cavity and acousto-optic deflector designs. The constants A and B may be determined by applying the same drive frequency ($f_{DRIVE}$) to each of the transducers 32, 34 and monitoring the output wavelength ($\lambda_{out}$) as $f_{DRIVE}$ is varied over a selected frequency range. The drive frequency and the output wavelength should follow the following linear relationship:

$$f_{DRIVE} = A + B\lambda_{OUT} \quad (5)$$

Therefore, the constants A and B may be obtained directly from equation (5). In the exemplary implementation described above, in which an acoustic frequency of 30 MHz corresponds to a wavelength of 1600 nm, and a frequency of 70 MHz corresponds to, a wavelength of 1500 nm, A=670 MHz and B=−400 MHz/μm.

Equations (2) and (4) may be solved simultaneously to give direct expressions for the acoustic drive frequencies $f_1$ and $f_2$. The results are:

$$f_2 = A + B\lambda + \frac{\alpha}{4}\frac{d\lambda}{dt} \quad (6)$$

and $$f_1 = A + B\lambda - \frac{\alpha}{4}\frac{d\lambda}{dt} \quad (7)$$

Thus, for a given wavelength profile ($\lambda$ as a function of time), equations (6) and (7) specify how to compute a pair of acoustic frequency profiles that assure continuous tuning. The first and second frequency profiles differ by an amount proportional to $d\lambda/dt$, which is the time rate of change of the desired output wavelength profile $\lambda$.

As a first example, the light source is required to deliver an output which is a continuous linear chirp. That is, the instantaneous wavelength increases linearly with time according to the relationship:

$$\lambda = \lambda_m + \dot{\lambda}t \quad (8)$$

where $\lambda_m$ and $\dot{\lambda}$ are constants which represent the wavelength at time t=0 and the chirp rate respectively. Under these conditions, the drive waveform applied to the first acousto-optic deflector will simply be a time displaced version of the drive waveform applied to the second acousto-optic deflector, i.e.

$$f_2(t) = f_1(t + \Delta t) \quad (9)$$

where $\Delta t$ is the time delay between the two waveforms. To demonstrate this, substitute equations (8) and (9) into equations (6) and (7) to obtain $$A + B[\lambda_m + \dot{\lambda}t] + \frac{\alpha}{4}\dot{\lambda} = A + B[\lambda_m + (t + \Delta t)] - \frac{\alpha}{4}\dot{\lambda} \quad (10)$$

Simplifying this expression leads to the result $$\Delta t = \frac{\alpha}{2B} \quad (11)$$

Since $\alpha$ and B are both constants, this establishes that, for a linear chirp, the delay between the drive waveforms is indeed constant, with a magnitude ($\alpha/2B$). In the general case, it is not necessarily true that the drive waveform applied to one of the two acousto-optic deflectors is a time displaced version of the waveform applied to the other acousto-optic deflector. However, in practice, this is almost invariably approximately the case.

As a second example, which illustrates this point, assume that the wavelength is to vary sinusoidally with time in accordance with equation (12):

$$\lambda = \lambda_m + \frac{\Delta\lambda}{2}\sin\Omega t \qquad (12)$$

where $\lambda_m$ is the center wavelength, $\Delta\lambda$ is the wavelength range, and $\Omega$ is the angular frequency of the wavelength variation. The required acoustic frequency profiles are then:

$$f_2 = A + B\lambda_m + C\sin(\Omega t + \varphi) \qquad (13)$$

and $$f_1 = A + B\lambda_m + C\sin(\Omega t - \varphi) \qquad (14)$$

where $$C = \frac{\Delta\lambda}{2}\sqrt{B^2 + (\alpha\Omega/4)^2} \qquad (15)$$

and $$\phi = \tan^{-1}\left(\frac{\alpha\Omega}{4B}\right) \qquad (16)$$

In practice, very often the phase angle $\phi$ is very much smaller than 90°. This allows the acoustic frequencies to be closely approximated as:

$$f_2 = A + B\left[\lambda_m + \frac{\Delta\lambda}{2}\sin\Omega\left(t + \frac{\alpha}{4B}\right)\right] \qquad (17)$$

and $$f_1 = A + B\left[\lambda_m + \frac{\Delta\lambda}{2}\sin\Omega\left(t - \frac{\alpha}{4B}\right)\right] \qquad (18)$$

Figure 4:
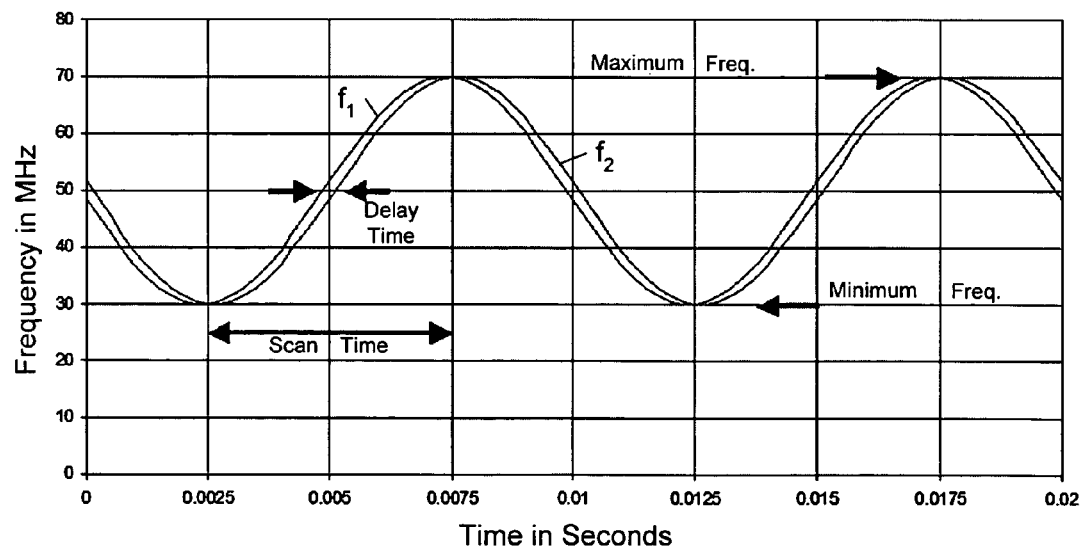
FIG. 4 is a graphical illustration of the drive waveforms applied to an implementation of the wavelength tunable light source of FIG. 1 in accordance with the method of FIG. 3.

Thus, as shown in FIG. 4, the two acoustic frequencies both vary sinusoidally. The sinusoidal variations are out of phase, the time difference being ($\alpha/2B$). For the values assumed here, this time difference is $2\times10^5/2\times400=250$ μs. The frequency profiles of the acoustic drives are illustrated below for a scan time of 5 ms (corresponding to $\Omega=200\pi$ radians/second).

In the above-described example, a sinusoidal wavelength profile was used for the transducer drive signals. The above-described technique for calculating the acoustic frequency profiles that will produce a specified, continuously tuned wavelength profile is general. Therefore, the acoustic frequency drive signal profiles may be any type of time-varying profile, including but not limited to sinusoidal, sawtooth, and linear ramp profiles.

The method of wavelength tuning shown in FIG. 3 may be applied to any type of light source that includes a resonant optical path with any type of acousto-optic tuning devices, including acousto-optic deflectors, acousto-optic modulators, and acousto-optic transmission filters.

Figure 5:
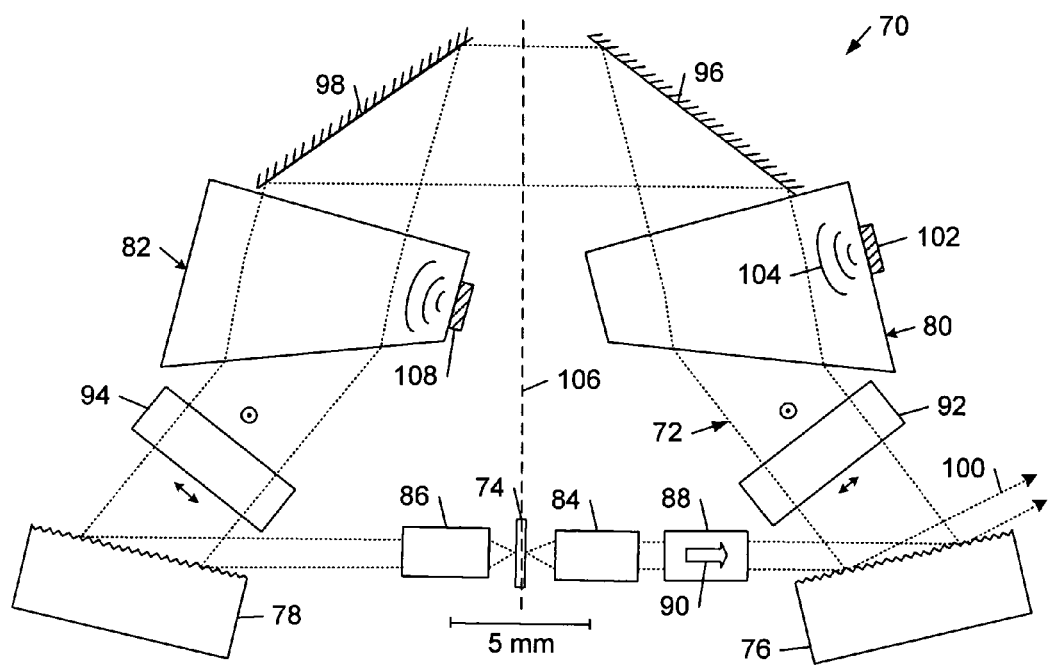
FIG. 5 is a diagrammatic plan view of a second embodiment of a wavelength tunable light source.

FIG. 5 shows an embodiment of a wavelength tunable light source 70 that includes a circulating (or ring-shaped) resonant light path 72 containing an optical gain medium 74, first and second optical gratings 76, 78, and first and second acousto-optic deflectors 80, 82. A first collimating lens 84 transforms an outgoing light beam diverging from the optical gain medium 74 into a parallel beam, and a second collimating lens 86 focuses the parallel incoming light beam onto the optical gain medium 74. An optical isolator 88 only allows light traveling in the direction of the arrow 90 to circulate around the resonant light path 72. The illustrated embodiment also includes first and second half-wave plates 92, 94 that are positioned in the light path 72 to rotate the polarization of the oscillating light from parallel to the plane of FIG. 5 to perpendicular to the plane of FIG. 5, and vice versa, as shown. Other embodiments may not include the first and second half-wave plates 92, 94. In addition, first and second folding mirrors 96, 98 are positioned between the first and second acousto-optic deflectors 80, 82 to fold the light around the circulating resonant light path 72. The components of light source 70 may be implemented in the same way as the corresponding components described above in connection with light source 10.

In operation, light diverges from the right hand face of the gain medium 74 and enters the first collimating lens 84, which transforms the diverging light into a parallel beam. The parallel beam passes through the isolator 88, which allows only light traveling in the direction of the arrow 90 to be transmitted so that light circulates around the resonant optical path 72 only in an anticlockwise direction.

Next, the beam strikes the first diffraction grating 76 at an incidence angle of about 13.5° relative to the grating surface. In one exemplary implementation, the light source 70 is tuned to oscillate at a wavelength of 1550 nm (which corresponds to an optical frequency of about 193.4 THz) and the grating 76 is ruled with 900 grooves/mm. Accordingly, in this exemplary implementation, the first order diffracted beam (shown in FIG. 5) make an angle of about 65° relative to the grating surface. About 90% of the incident light will be diffracted into this first order beam, and about 10% will be reflected into an output beam 100, which corresponds to the zero order reflection of the incident beam.

At this stage, all these light beams are horizontally polarized in a plane parallel to the plane of FIG. 5. In the illustrated embodiment, the first half-wave plate 92 rotates the polarization of the horizontally polarized light to a vertical beam polarized in a plane perpendicular to the plane of FIG. 5.

The vertically polarized beam then enters the first acousto-optic deflector 80 at an angle of about 44° to its surface. An acoustic transducer 102 of the first acousto-optic deflector 80 is powered by an RF signal that is applied through a matching network. The frequency of the RF signal is equal to the acoustic frequency. In one implementation, the applied RF power is on the order of 2 Watts. For the light to oscillate in light path 72 at 1550 nm, the frequency of the RF signal is set to about 50 MHz. One effect of the acoustic waves 104 that are induced within the acousto-optic deflector 80 is to deflect the input light beam by about 4.6°, as is shown schematically in FIG. 5. The deflected light passes through the exit face of the first acousto-optic deflector 80 at normal incidence angle for all wavelengths at which the light oscillates within the resonant optical path 72.

As explained above, a second effect of the interaction between the input light beam and the acoustic waves 104 is a shifting of the optical frequency of the input light beam. In the exemplary implementation described above, the optical frequency of the light before it encounters the acoustic waves 104 is exactly 193.4 THz, or equivalently 193,400,000 MHz. In the first acousto-optic deflector 80, the acoustic waves 104 interact with the light beam so as to deflect the light beam away from the ultrasonic source. As a consequence, the optical frequency of the deflected light beam is increased (or "upshifted") by 50 MHz to 193,400,050 MHz.

After reflection from the two folding mirrors 96, 98, the light passes through the left hand half of the resonant optical path 72, which substantially corresponds to a "mirror image" of the right hand half reflected through a mirror plane 106, which is perpendicular to the plane of FIG. 5. The only departures from symmetry are the absence in the left hand half of the cavity of an isolator corresponding to isolator 88, and the asymmetrical location of the transducer 108 of the second acousto-optic deflector 82. In the second acousto-optic deflector 82, the light beam is deflected towards the ultrasonic source. Therefore, with respect to the exemplary implementation described above, for a 50 MHz acoustic frequency, the optical frequency of the incoming 193,400,050 MHz light is decreased to 193,400,000 MHz. Therefore, the optical frequency of the light arriving back at the gain medium 74 is the same as the optical frequency of the outgoing light from the gain medium 74.

As explained above, light circulates around the resonant optical path 72 in an anticlockwise direction. In one implementation, the cavity and acousto-optic deflector geometries are designed so that, when both acoustic transducers 102, 104 are vibrating at 50 MHz, the wavelength of the oscillating light is about 1550 nm. The deflection of the optical beam within the acousto-optic deflectors is about 4.6° at this acoustic frequency.

The oscillating light wavelength is controlled by the frequencies of the RF signals applied to the acoustic transducers 102, 108. In the exemplary implementation described above, when 30 MHz drive signals are applied to the transducers 102, 108, the oscillating light wavelength is about 1600 nm and the deflections within the acousto-optic deflectors is about 3.6°. When 70 MHz drive signals are applied to the transducers 102, 108, the oscillating light wavelength is about 1500 nm and the deflections within the acousto-optic deflectors is about 5.5°.

The wavelength of the output light produced by light source 70 may be tuned in accordance with any of the tuning methods described above in connection with light source 10. In particular, the acousto-optic deflectors may be driven by non-identical drive signals specifically selected to assure continuous tuning.

Figure 6:
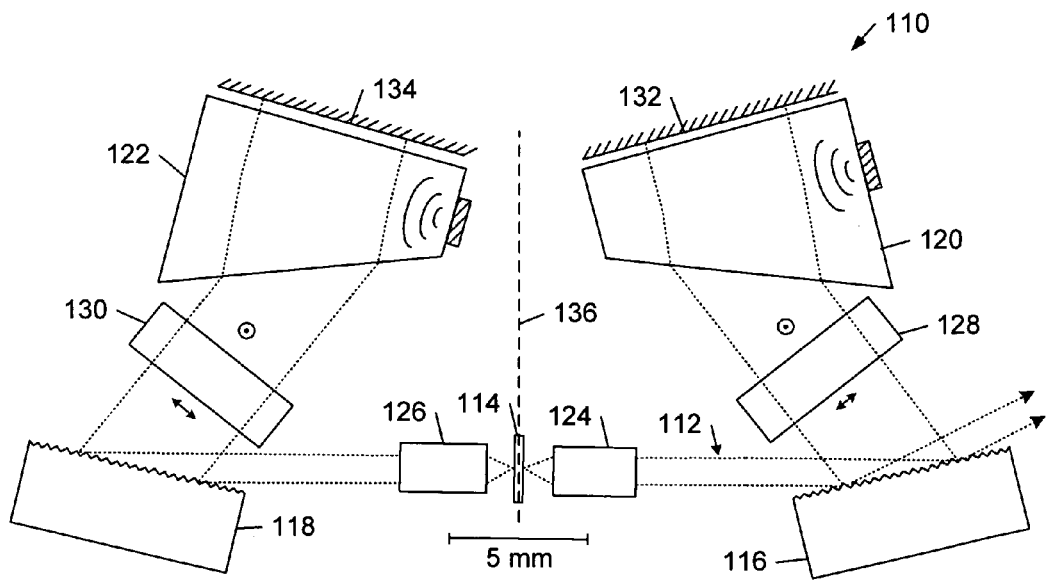
FIG. 6 is a diagrammatic plan view of a third embodiment of a wavelength tunable light source.

FIG. 6 shows an embodiment of a wavelength tunable light source 110 that includes a resonant light path 112 containing an optical gain medium 114, first and second optical gratings 116, 118, and first and second acousto-optic deflectors 120, 122. First and second collimating lenses 124, 126 transform light diverging from the optical gain medium 114 into parallel beams and focus incoming parallel light beams onto the optical gain medium 114. The illustrated embodiment also includes first and second half-wave plates 128, 130 that are positioned in the light path 112 to rotate the polarization of the oscillating light from parallel to the plane of FIG. 6 to perpendicular to the plane of FIG. 6, and vice versa, as shown. Other embodiments may not include the first and second half-wave plates 128, 130. In addition, first and second mirrors 132, 134 are positioned behind the first and second acousto-optic deflectors 120, 122, respectively, to reflect light at the ends of resonant light path 112.

In the embodiment illustrated in FIG. 6, the first grating 116 and the first acousto-optic deflector 120 are arranged in a first segment of the light path 112, and the second grating 118 and the second acousto-optic deflector 122 are arranged in a second segment of the light path 112. In this embodiment, the first light path segment substantially corresponds to a mirror image of the second light path reflected through a mirror plane 136 that is perpendicular to the plane of FIG. 6 and is oriented normal to the light beam at the location of the gain medium 114. The only departure from symmetry is the asymmetrical positioning of the first and second acousto-optic drive transducers. The components of light source 110 may be implemented in the same way as the corresponding components described above in connection with light source 10. In addition, the wavelength of the output light produced by light source 110 may be tuned in accordance with any of the tuning methods described above in connection with light source 10.

Figure 7:
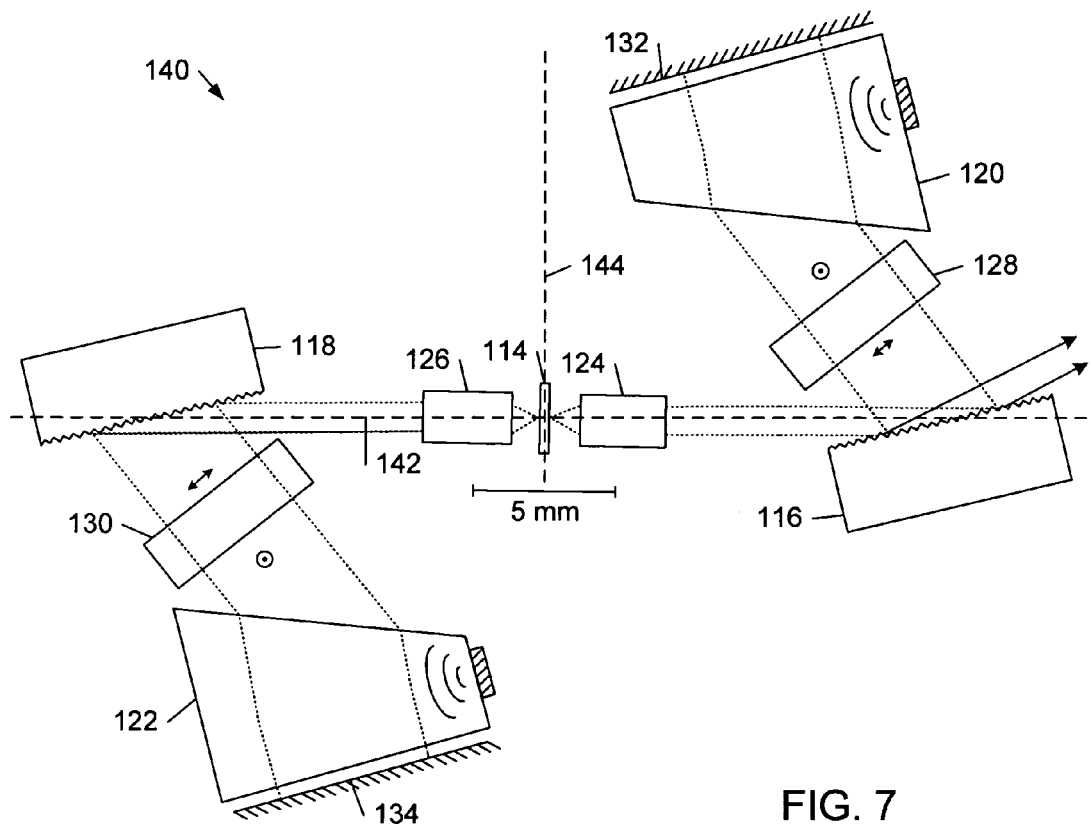
FIG. 7 is a diagrammatic plan view of a fourth embodiment of a wavelength tunable light source.
Figure 8:
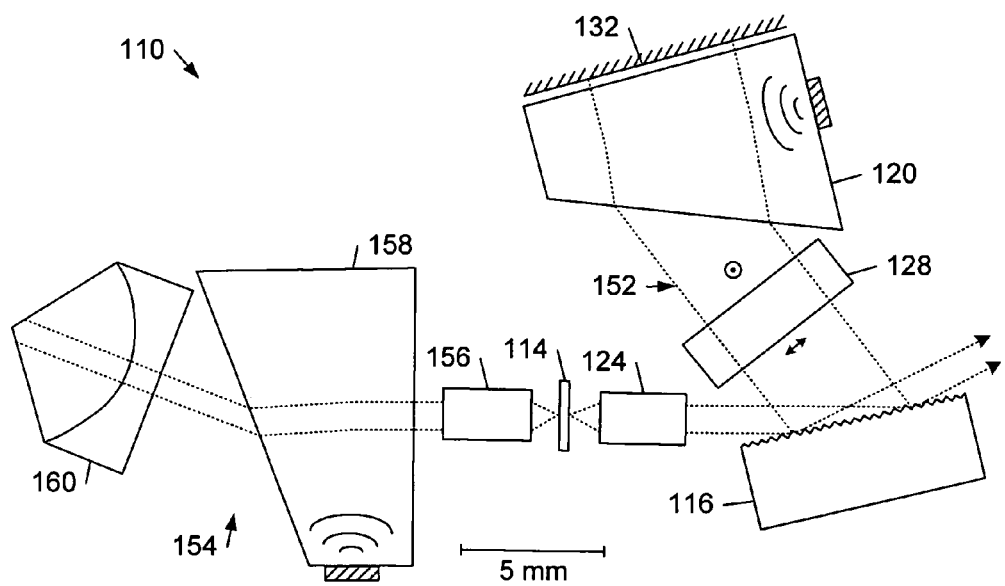
FIG. 8 is a diagrammatic plan view of a fifth embodiment of a wavelength tunable light source.

FIG. 7 shows an embodiment of a wavelength tunable light source 140 that is identical to the light source 110, except that the second segment of the resonant light path 112 has been flipped about an axis corresponding to direction of light travel between the second collimating lens 126 and the second optical grating 118. In this embodiment, the first light path segment substantially corresponds to a mirror image of the second light path reflected through a pair of orthogonal mirror planes 142, 144 that are perpendicular to the plane of FIG. 6 and that intersect at the location of the gain medium 114. The only departure from symmetry is the asymmetrical positioning of the first and second acousto-optic drive transducers. FIG. 8 shows an embodiment of a wavelength tunable light source 150 that includes a first light path segment 152 that is identical to the first light path segment of the wavelength tunable light source 110 shown in FIG. 6. This embodiment additionally includes a second light path segment 154 that includes a second collimating lens 156, a second acousto-optic deflector 158, and a retroreflector 160. The operation of light source 160 is very similar to the operation of light source 110, except that the filter function is now determined by the first and second acousto-optic deflectors 120, 158 and the single optical grating 116.

Other embodiments are within the scope of the claims.

What is claimed is:

1. A wavelength tunable light source, comprising:
a resonant light path supporting oscillation of light in at least one longitudinal mode; an optical gain medium disposed in the resonant light path;
an optical reflection grating have a reflective grating surface arranged to receive incident light along the light path at an incidence angle relative to the grating surface and to diffract light from the reflective grating surface along the light path at a diffraction angle relative to the grating surface different from the incidence angle;
a first acousto-optic deflector arranged to intercept light along the light path, and operable to deflect the intercepted light and to induce a first Doppler shift of longitudinal mode frequencies; and
a second acousto-optic deflector arranged to intercept light along the light path, and operable to deflect the intercepted light and to induce a second Doppler shift of longitudinal mode frequencies, wherein the first and second Doppler shifts are in opposite directions.

2. The wavelength tunable light source of claim 1, further comprising a second optical grating have a grating surface arranged to receive incident light along the light path at a second incidence angle relative to the grating surface and to diffract light along the light path at a second diffraction angle relative to the grating surface different from the second incidence angle.

3. The wavelength tunable light source of claim 2, wherein the first grating and the first acousto-optic deflector together produce a first optical frequency filter function and the second grating and the second acousto-optic deflector together produce a second optical frequency filter function substantially identical to the first optical frequency filter function.

4. The wavelength tunable light source of claim 2, wherein the first grating and the first acousto-optic deflector are arranged in a first segment of the light path and the second grating and the second acousto-optic deflector are arranged in a second segment of the light path.

5. The wavelength tunable light source of claim 4, wherein the first light path segment substantially corresponds a mirror image of the second light path reflected through a mirror plane.

6. The wavelength tunable light source of claim 2, wherein the optically resonant light path is defined between a first mirror and a second mirror.

7. The wavelength tunable light source of claim 6, wherein the gain medium, the first grating, the first acousto-optic deflector, the second acousto-optic deflector, and the second grating elements are arranged in order along the light path from the first mirror to the second mirror.

8. The wavelength tunable light source of claim 7, further comprising a first half-wave plate disposed between the first grating and the first acousto-optic deflector, and a second half-wave plate disposed between the second grating and the second acousto-optic deflector.

9. The wavelength tunable light source of claim 6, wherein the first acousto-optic deflector, the first grating, the gain medium, the second grating, and the second acousto-optic deflector are arranged in order along the light path from the first mirror to the second mirror.

10. The wavelength tunable light source of claim 9, wherein the first grating and the first acousto-optic deflector are arranged in a first segment of the light path and the second grating and the second acousto-optic deflector are arranged in a second segment of the light path.

11. The wavelength tunable light source of claim 10, wherein the first light path segment arrangement substantially corresponds to a mirror image of the second light path arrangement reflected through a mirror plane.

12. The wavelength tunable light source of claim 10, wherein the first light path segment arrangement substantially corresponds to a mirror image of the second light path arrangement reflected through a pair of substantially orthogonal mirror planes.

13. The wavelength tunable light source of claim 2, wherein the light path is a circulating light path.

14. The wavelength tunable light source of claim 13, wherein the gain medium, the first grating, the first acousto-optic deflector, the second acousto-optic deflector, and the second grating are arranged in order along the circulating light path.

15. The wavelength tunable light source of claim 14, further comprising first and second mirrors disposed in the circulating light path between the first and second acousto-optic deflectors.

16. The wavelength tunable light source of claim 14, further comprising an optical isolator disposed in the circulating light path.

17. The wavelength tunable light source of claim 1, wherein the optically resonant light path is defined between a first mirror and a second mirror.

18. The wavelength tunable light source of claim 17, wherein at least one of the first and second mirrors is a retroreflector.

19. The wavelength tunable light source of claim 18, wherein the first acousto-optic deflector, the gain medium, the grating, and the second acousto-optic deflector are arranged in order along the light path from the first mirror to the second mirror.

20. The wavelength tunable light source of claim 1, further comprising a driver that is connected to the first and second acousto-optic deflectors and drives the first acousto-optic deflector with a first signal having a first time-varying frequency profile and drives the second acousto-optic deflector with a second signal having a second time-varying frequency profile substantially corresponding to a time-shifted version of the first time-varying frequency profile.

21. The wavelength tunable light source of claim 1, further comprising a driver that is connected to the first and second acousto-optic deflectors and performs operations comprising:
driving the first acousto-optic device with a first signal having a first time-varying frequency profile; and
driving the second acousto-optic device with a second signal having a second time-varying frequency profile, wherein the second time-varying frequency profile differs from the first time-varying frequency profile by an amount substantially proportion to a time rate of change of the output wavelength profile;
wherein the output light beam is tunable over the specified frequency range without observable hopping between longitudinal modes.

22. The wavelength tunable light source of claim 21, wherein the first and second acousto-optic devices are selected from: acousto-optic deflectors; acousto-optic modulators; and acousto-optic tunable filters.

23. A wavelength tunable light source, comprising:
a resonant light path supporting oscillation of light in at least one longitudinal mode;
an optical gain medium disposed in the resonant light path;
an optical grating have a grating surface arranged to receive incident light along the light path at an incidence angle relative to the grating surface and to diffract light along the light path at a diffraction angle relative to the grating surface different from the incidence angle;
a first acousto-optic deflector arranged to intercept light along the light path, and operable to deflect the intercepted light and to induce a first Doppler shift of longitudinal mode frequencies;
a second acousto-optic deflector arranged to intercept light along the light path, and operable to deflect the intercepted light and to induce a second Doppler shift of longitudinal operations comprising:
driving the first acousto-optic device with a first signal having a first time-varying frequency profile; and
driving the second acousto-optic device with a second signal having a second time-varying frequency profile, wherein the second time-varying frequency profile differs from the first time-varying frequency profile by an amount substantially proportion to a time rate of change of the output wavelength profile;
wherein the output light beam is tunable over the specified frequency range without observable hopping between longitudinal modes, and
the first and second time-varying frequency profiles ($f_1$ and $f_2$) are give by:

$$f_2 = A + B\lambda + \alpha/4 \, d\lambda/dt$$

and $$f_1 = A + B\lambda + \alpha/4 \, d\lambda/dt$$

wherein A, B, and a are constants and $d\lambda/dt$ is the time range of change of the output wavelength profile $\lambda$.

* * * * *